US006525357B1

(12) United States Patent
Amano et al.

(10) Patent No.: US 6,525,357 B1
(45) Date of Patent: Feb. 25, 2003

(54) BARRIER LAYERS FERROELECTRIC MEMORY DEVICES

(75) Inventors: Jun Amano, Hillsborogh, CA (US); Laura Wills Mirkarimi, Surol, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/420,989

(22) Filed: Oct. 20, 1999

(51) Int. Cl.[7] .............................................. H01L 27/108
(52) U.S. Cl. ........................ 257/295; 257/296; 257/300
(58) Field of Search .......................... 257/15, 295, 595, 257/314, 296, 300, 305, 307; 438/3; 365/184

(56) References Cited

U.S. PATENT DOCUMENTS

| | | | | |
|---|---|---|---|---|
| 3,832,700 A | | 8/1974 | Wu et al. | 340/173.2 |
| 5,365,094 A | | 11/1994 | Takasu | |
| 5,572,052 A | | 11/1996 | Kashihara et al. | |
| 5,753,945 A | * | 5/1998 | Chivukula et al. | 257/295 |
| 5,767,541 A | | 6/1998 | Hanagasaki | 257/295 |
| 5,877,977 A | | 3/1999 | Essaian | |
| 5,933,316 A | | 8/1999 | Ramakrishnan et al. | |
| 5,955,755 A | | 9/1999 | Hirai et al. | |

FOREIGN PATENT DOCUMENTS

| | | |
|---|---|---|
| EP | 0540993 A1 | 5/1993 |
| JP | 11126878 | 5/1999 |

OTHER PUBLICATIONS

Alexander, et al., "Dielectric Characterization of Sol–Gel Derived Sn Doped $ZrTiO^4$ Thin Films", Integrated Ferroelectrics, 17:221–230 (1997).

Shin, et al., "An Optimized Process and Characterization of $Pb(Zr,Ti)O_3$ Ferroelectric Capacitor for 1T/1C Ferroelectric RAM," Mat. Res. Soc. Symp. Proc., 493:281–286 (1998).

* cited by examiner

*Primary Examiner*—Olik Chaudhuri
*Assistant Examiner*—Hoa B. Trinh

(57) ABSTRACT

Unfavorable interactions of ferroelectric dielectric layers with silicon, intermetallic dielectrics, and other materials in metal-oxide semiconductor devices have discouraged the use of ferroelectric memory devices. This invention provides a zirconium titanate barrier layer with high insulating and low leakage characteristics. The barrier layer is not reactive with silicon or other materials used in metal-ferroelectric-semiconductor devices. These thermally stable layers should facilitate the integration of ferroelectric materials into memory and other semiconductor devices.

4 Claims, 3 Drawing Sheets

32
30
10
34
36
27
26
28
25
21
24
17
23
19
18
22
20
12
14
16

BARRIER LAYERS FERROELECTRIC MEMORY DEVICES

FIELD OF THE INVENTION

This invention relates to barrier layers for semi-conductor devices, specifically to barrier layers for ferroelectric memory devices.

BACKGROUND OF THE INVENTION

Ferroelectric memories (FeRAM) combine advantages of both nonvolatile read only memory (ROM) and high speed random access memory (RAM). Two types of ferroelectric memory have been proposed in the prior art. One type, one transistor and one capacitor (1T-1C) memory, has a structure similar to that of the conventional dynamic random access memory. Such prior art memories are described, for example, in U.S. Pat. No. 5,767,541 to Hanagasaki, incorporated herein by reference. Fabrication of the 1T-1C ferroelectric memory is relatively easy because the ferroelectric capacitor stacks are separated from the complementary metal-oxide semiconductor (CMOS) transistor layers by a thick interlayer dielectric film. However, while the ferroelectric medium in the capacitor is separated from CMOS transistor layers, there remain several critical integration related issues affecting the reliability of FeRAM. The interaction of a ferroelectric, such as $PbZr_{1-x}Ti_xO_3$ (PZT), capacitor with intermetallic dielectrics (IMD) and damage to the ferroelectric capacitor stacks due to hydrogen attack during IMD and subsequent metal and plug deposition are the most serious problems in the manufacture of high density FeRAM. Therefore, an encapsulating barrier layer between the PZT capacitor and IMD layer with high insulating and low leakage characteristics is necessary. At present, several metal oxides, such as $TiO_2$, have been tested for this application; however, their performance is not satisfactory for high density FeRAM.

Another type of ferroelectric memory is the one transistor (1T) field effect type. Such devices are described, for example, by U.S. Pat. No. 3,832,700 to Wu, et al, incorporated herein by reference. At present, there is no reliable fabrication process available for this type of ferroelectric memory. Such a process would involve direct deposition of a ferroelectric layer on a silicon substrate in order to create a metal-ferroelectric-semiconductor field effect transistor (MFS FET). However, fabrication of a MFS FET incorporating PZT is extremely difficult because of the interaction of the PZT layer with Si and the formation of a low dielectric constant $SiO_2$ layer between the PZT layer and the Si substrate. For example, diffusion of oxygen through the layers of the memory device to the silicon substrate may result in the formation of an $SiO_2$ layer between the substrate and the adjacent ferroelectric layer, disrupting electrical communication between the substrate and the PZT layer. Lead atoms may subsequently leach out of the ferroelectric layer into the newly formed glassy $SiO_2$ layer, disrupting the network of silica bonds in the $SiO_2$ layer and further altering the electrical performance of the transistor. Several attempts have been made to fabricate MFS FETs using various barrier layers such $Si_3N_4$, $CeO_2$, and $Y_2O_3$; however, none of them have produced satisfactory and reproducible results.

SUMMARY OF THE INVENTION

In one aspect, the invention is a method of preventing detrimental chemical and electrical interaction between two materials, especially a ferroelectric material and an adjacent material in a multi-layered electrical device. The method comprises disposing an electrically insulating, thermally and chemically stable barrier layer between the ferroelectric material and the adjacent, non-ferroelectric material. In one embodiment, the barrier layer restricts current flow and oxygen diffusion between the ferroelectric material and the non-ferroelectric material. In addition, the barrier layer is not reactive with the non-ferroelectric material. In this embodiment, the device may include a ferroelectric transistor, and the non-ferroelectric layer may be a semi-conductor substrate. In another embodiment, the device may include a ferroelectric capacitor, and the barrier layer may protect the capacitor from damage during formation of the non-ferroelectric layer. In either of these embodiments, the barrier layer may comprise a mixed transition metal oxide which may in turn comprise $ZrTiO_4$ or $SrTiO_3$, and the ferroelectric material may comprise $PbZr_{1-x}Ti_xO_3$, $SrBi_2Ta_2O_9$, and $BaSr_xTi_{1-x}O_3$. The barrier layer should have a high dielectric constant, preferably at least 10, more preferably at least 20, and even more preferably at least 30.

In another aspect, this invention is a multi-layer electrical device comprising a ferroelectric and a non-ferroelectric material and an electrically insulating, thermally stable barrier layer disposed between them. The multi-layer electrical device may be produced according to the method described above.

To form a barrier layer according to this invention, a high dielectric constant barrier layer disposed between the ferroelectric layer and Si substrate is preferred. The barrier layer should also exhibit low leakage current, a high breakdown voltage, and a low diffusivity for oxygen and other atoms comprising the ferroelectric material. For both 1T and 1T-1C devices, the layer should also exhibit high thermal and chemical stability.

DETAILED DESCRIPTION

In one preferred embodiment, the invention employs thermally stable dielectric zirconium titanate ($ZrTiO_4$) films as barrier layers to solve the problems described above. Zirconium titanate thin films have a high dielectric constant ($\epsilon$~30) and very low leakage current and are thermally stable up to 700° C. In addition, zirconium titanate layers are known to be excellent oxygen barriers. The similar compositions of zirconium titanate and PZT materials prevent detrimental chemical and electrical interactions between the two materials. These films can be easily deposited by either metal organic chemical vapor deposition (MOCVD) or reactive sputtering. MOCVD is a preferred method for the manufacture of high density FeRAM in order to achieve conformal coverage. Therefore, zirconium titanate thin films are excellent candidates for the barrier layer for both 1T-1C and 1T FeRAMs. Zirconium titanate barrier layers inhibit interactions of PZT with IMD layers in 1T-1C devices and minimize formation of $SiO_2$ layers at the interface with the Si substrate in 1T FeRAM devices. In addition, the barrier layer is not reactive with other adjacent layers in the device. Other mixed transition metal oxides, for example, $SrTiO_3$ and some other perovskite materials, can also be used to produce the barrier layers of the invention. These materials can also serve as barrier layers for other ferroelectric materials, for example, $SrBi_2Ta_2O_9$ and $BaSr_xTi_{1-x}O_3$. The barrier layer thus formed is thermally and chemically stable, especially with respect to oxide formation, and has a high dielectric constant, preferably at least 10, more preferably at least 20 and even more preferably at least 30.

Figure 1A:
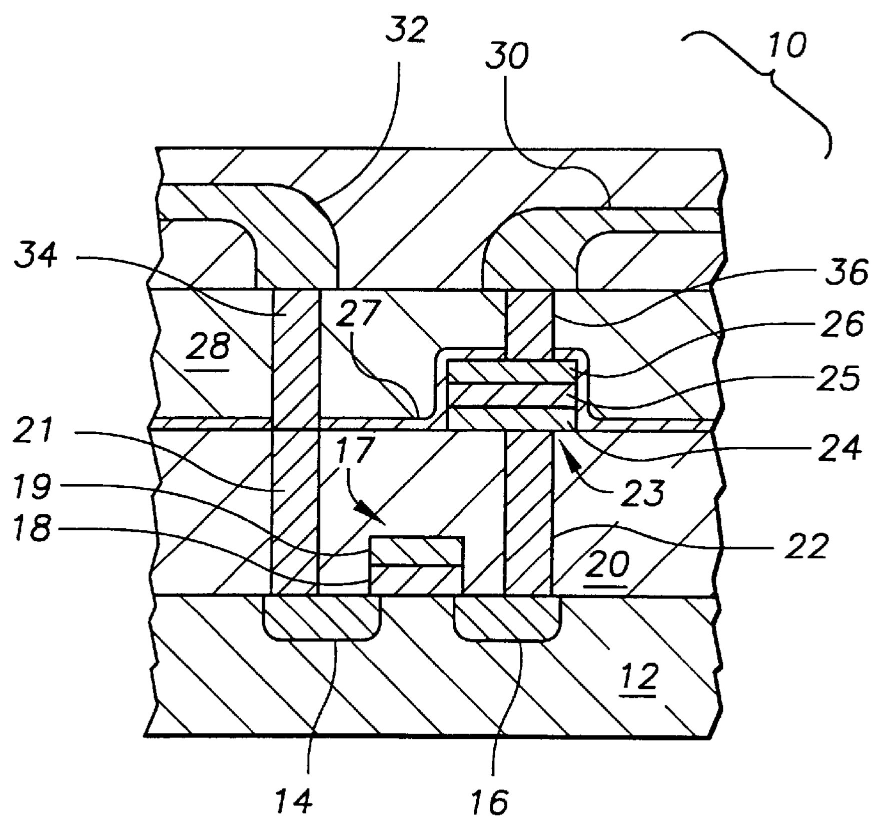
FIG. 1A is a cross-sectional view of a 1T-1C FeRAM device.
Figure 1B:
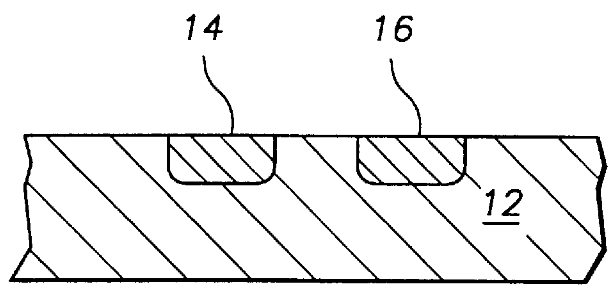
FIGS. 1B-1G are cross-sectional views of a 1T-1C FeRAM device at various stages of production.
Figure 1C:
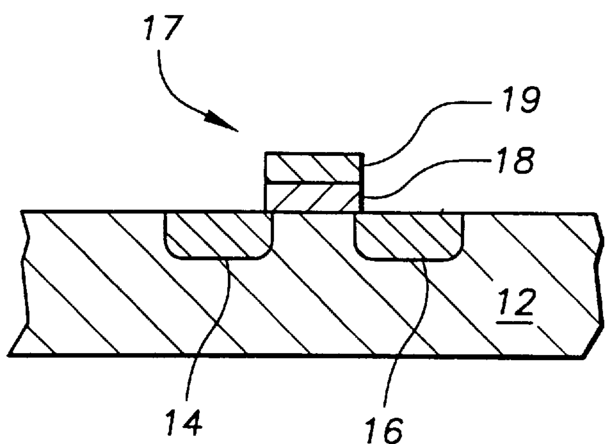
Figure 1D:
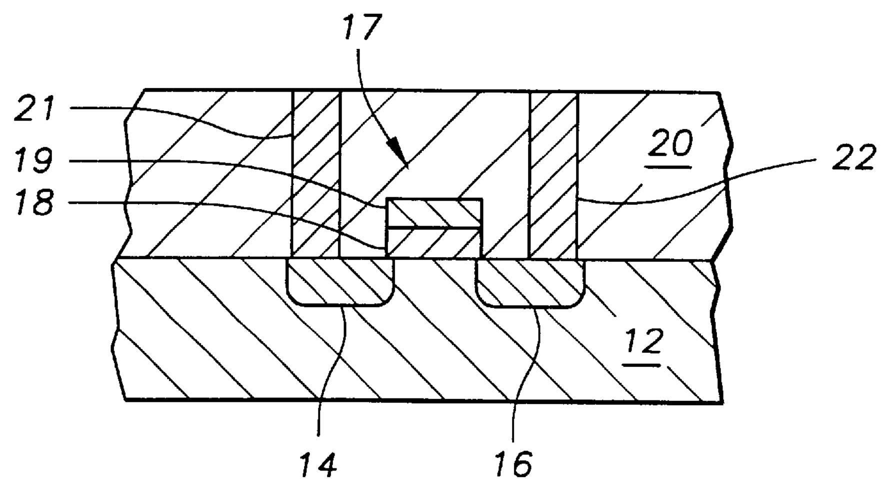
Figure 1E:
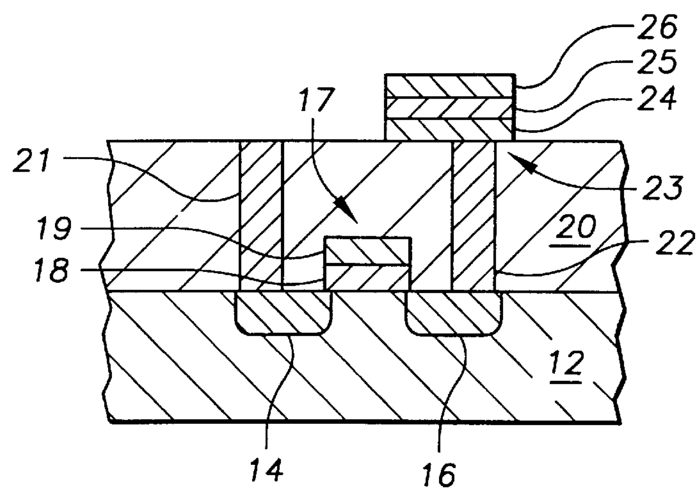
Figure 1F:
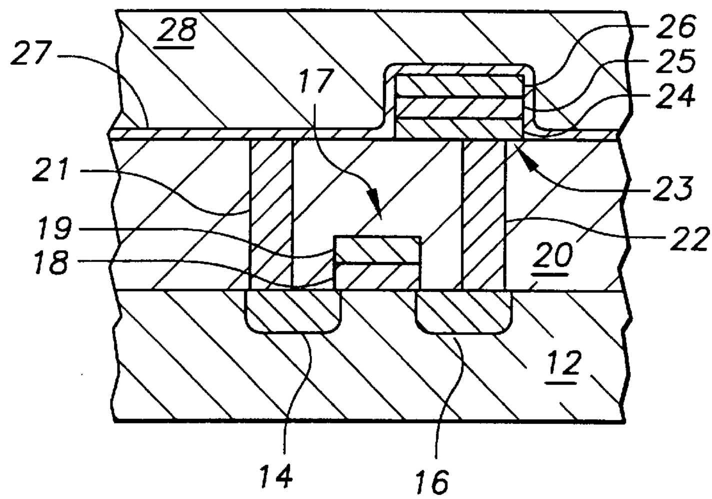
Figure 1G:
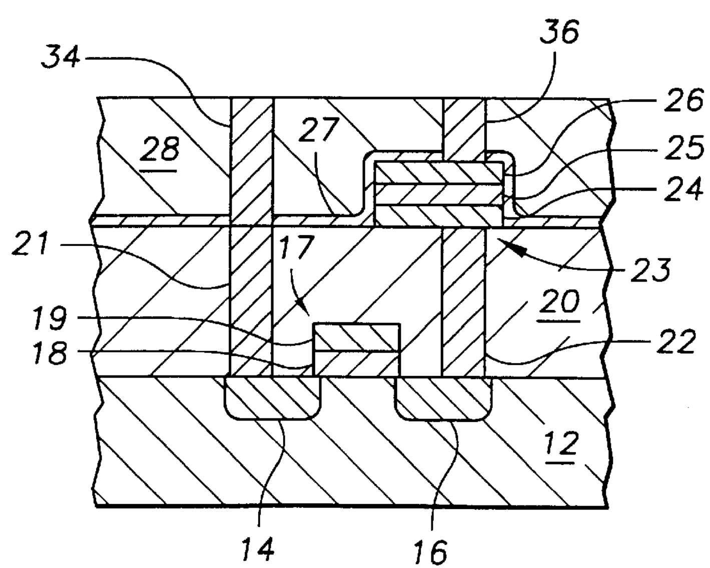

A 1T-1C device 10 according to the invention is shown in FIG. 1A. The memory device 10 comprises transistor 17 and ferroelectric capacitor 23 deposited in layers on a silicon or other semiconductive substrate 12. A barrier layer 27 is disposed over the capacitor 23. Techniques for the manufacture of prior art 1T-1C devices are well known in the art. One skilled in the art will recognize that such techniques can be easily adapted to produce a 1T-1C device according to the invention. The substrate 12 is processed to provide a source 14 and drain 16 region (FIG. 1B). A dielectric 18 and metal gate 19 are disposed between the source 14 and drain 16 to form transistor 17 (FIG. 1C). An interlayer dielectric 20 (ILD) is deposited, covering the transistor 17 and the substrate 12, and plugs 21 and 22 are disposed within the ILD to contact the source 14 and drain 16, respectively (FIG. 1D). The materials for a bottom electrode, usually platinum, a ferroelectric layer, and a top electrode, also usually platinum, are laminated sequentially on the surface. The ferroelectric layer preferably comprises PZT. These layers are then etched together to form ferroelectric capacitor 23 comprising a bottom electrode 24, ferroelectric layer 25, and a top electrode 26 (FIG. 1E). Barrier layer 27 is then deposited around at least the exposed surfaces of the capacitor. However, while it is only necessary to dispose the barrier layer 27 over the capacitor, if the barrier layer is deposited using standard techniques (e.g., MOCVD, see below), then it will cover not only the capacitor 23 but the other exposed surfaces of the device, as shown in FIG. 1F. Portions of the barrier layer 27 may be selectively removed to re-expose these other surfaces. In FIG. 1G, for example, most of the barrier layer 27 has been left intact, but a section has been removed to enable electrical communication between plug-to-plug contact 34 and plug 21.

As noted above, $ZrTiO_4$ is preferred for the barrier layer 27. The barrier layer may be deposited via MOCVD or reactive sputtering. MOCVD is preferred to achieve conformal coverage of the sides as well as the upper surface of the capacitor. If necessary, the barrier layer can be etched following deposition to achieve a desired geometry. The device is completed according to prior art techniques. An intermetallic dielectric 28 (IMD) is deposited covering the barrier layer (FIG. 1F). The plug-to-plug contact 34 and a third plug 36 are disposed within the dielectric layers 20 and 28 to contact the plug 21 and top electrode 26, respectively (FIG. 1G). The plug-to-plug contact 34 and third plug 36 are connected to a word line 32 and bit line 30. Other insulating layers and conductors are disposed in the device according to techniques well known in the art (FIG. 1A).

Figure 2:
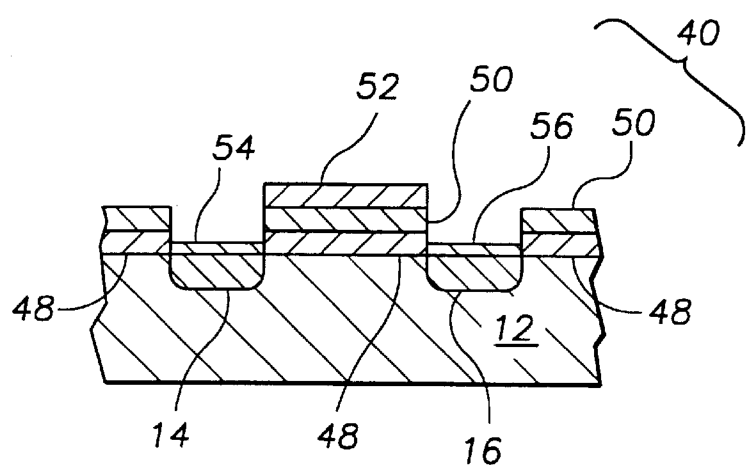
FIG. 2 is a cross-sectional view of a one transistor FeFET memory device.

A 1T device 40 according to the invention is shown in FIG. 2. Barrier layer 48 is disposed between a silicon or other semiconductive substrate 12 and ferroelectric layer 50. Deposition techniques for prior art 1T devices are well known in the art. One skilled in the art will recognize that such techniques can be easily adapted to produce a ferroelectric FET according to the invention. The substrate 12 is processed to form the source and drain regions 14 and 16. Barrier layer 48 is disposed between the source and drain regions 14 and 16. The barrier layer preferably comprises a metal oxide and more preferably comprises $ZrTiO_4$. Again, the barrier layer may be deposited by MOCVD or reactive sputtering.

Ferroelectric layer 50, preferably comprising PZT, and gate electrode 52 are deposited sequentially over the barrier layer. The layers can be masked and etched individually or together to expose the source and drain or achieve a desired geometry. Conductors must also be provided to connect the drain and source regions 16 and 14 and the gate electrode 52 to external circuitry. For example, source and drain electrodes 54 and 56 may be deposited on source and drain regions 14 and 16. The barrier layer 48 and ferroelectric layer 50 may extend beyond the drain and source regions, as shown in FIG. 2.

The methods described above for the production of 1T-1C and ferroelectric FET devices are meant to be exemplary and not limiting. The methods for deposition of the barrier layers in the devices above can be modified as the production techniques for memory devices are changed. For example, the barrier layer can be masked and etched after deposition if necessary. Alternatively, it can be etched in combination with other layers deposited before or afterwards. It is also evident that the techniques described above can be used to produce a plurality of transistors or other memory devices on a single semiconductor wafer.

Other embodiments of the invention will be apparent to those skilled in the art from a consideration of the specification or practice of the invention disclosed herein. It is intended that the specification and examples be considered as exemplary only, with the true scope of the invention being indicated by the following claims.

What is claimed is:

1. A multi-layer electrical device comprising a ferroelectric transistor comprising, the transistor comprising:

a semiconductor substrate comprising source and drain regions;

source and drain electrodes disposed over the source and drain regions, respectively, a dielectric layer comprising a ferroelectric material disposed between the source and drain electrodes;

an electrode disposed over the dielectric layer; and an electrically insulating, thermally and chemically stable barrier layer disposed between the substrate and the dielectric layer.

2. The device of claim 1, wherein the ferroelectric material comprises a material selected from the group consisting of $PbZr_{1-x}Ti_xO_3$, $SrBi_2Ta_2O_9$, and $BaSr_xTi_{1-x}O_3$.

3. The device of claim 1, wherein the dielectric constant is at least 20.

4. The device of claim 3, wherein the dielectric constant is at least 30.

* * * * *